United States Patent
Nishibe et al.

(10) Patent No.: US 11,086,030 B2
(45) Date of Patent: Aug. 10, 2021

(54) RADIATION IMAGING APPARATUS, MANUFACTURING METHOD THEREOF, AND RADIATION IMAGING SYSTEM

(71) Applicant: CANON KABUSHIKI KAISHA, Tokyo (JP)

(72) Inventors: Kota Nishibe, Kawasaki (JP); Takamasa Ishii, Honjo (JP); Tomohiro Hoshina, Kawasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 166 days.

(21) Appl. No.: 16/512,929

(22) Filed: Jul. 16, 2019

(65) Prior Publication Data

US 2020/0025953 A1    Jan. 23, 2020

(30) Foreign Application Priority Data

Jul. 23, 2018  (JP) .............................. JP2018-138015

(51) Int. Cl.
  *G01T 1/20* (2006.01)
  *G01T 1/29* (2006.01)
  *H01L 25/04* (2014.01)
  *H01L 31/18* (2006.01)

(52) U.S. Cl.
  CPC .......... *G01T 1/2018* (2013.01); *G01T 1/2928* (2013.01); *H01L 25/042* (2013.01); *H01L 31/18* (2013.01)

(58) Field of Classification Search
  CPC ..... G01T 1/2018; G01T 1/2928; G01T 1/202; G01T 1/2023; H01L 25/042; H01L 31/18; H01L 27/14663; H01L 27/1469
  USPC ..................................................... 250/370.11
  See application file for complete search history.

(56) References Cited

U.S. PATENT DOCUMENTS

| | | | |
|---|---|---|---|
| 6,747,277 B2 | 6/2004 | Mori et al. |
| 7,205,547 B2 | 4/2007 | Ishii et al. |
| 7,205,568 B2 | 4/2007 | Watanabe et al. |
| 7,435,968 B2 | 10/2008 | Watanabe et al. |
| 7,488,948 B2 | 2/2009 | Ishii et al. |
| 7,535,506 B2 | 5/2009 | Nomura et al. |
| 7,541,617 B2 | 6/2009 | Mochizuki et al. |
| 7,557,355 B2 | 7/2009 | Mochizuki et al. |

(Continued)

FOREIGN PATENT DOCUMENTS

| | | |
|---|---|---|
| JP | 2006-278877 | 10/2006 |
| JP | 2012-145474 | 8/2012 |

(Continued)

*Primary Examiner* — David P Porta
*Assistant Examiner* — Gisselle M Gutierrez
(74) *Attorney, Agent, or Firm* — Venable LLP

(57) ABSTRACT

A radiation imaging apparatus includes a sensor base, a sensor array that includes a plurality of sensor chips arranged in an array, and in which three or more sensor chips out of the plurality of sensor chips are arranged in one row of the sensor array, a scintillator positioned on a side opposite to the sensor base with respect to the sensor array, a bonding member that bonds the sensor array and the scintillator, and a plurality of bonding sheets that are separated from each other and bond the sensor base and the plurality of sensor chips. Two adjacent sensor chips out of the three or more sensor chips are bonded to the sensor base using separate bonding sheets out of the plurality of bonding sheets.

11 Claims, 8 Drawing Sheets

(56) References Cited

U.S. PATENT DOCUMENTS

| | | |
|---|---|---|
| 7,629,564 B2 | 12/2009 | Mochizuki et al. |
| 7,642,517 B2 | 1/2010 | Ishii et al. |
| 7,645,976 B2 | 1/2010 | Watanabe et al. |
| 7,812,313 B2 | 10/2010 | Mochizuki et al. |
| 7,812,317 B2 | 10/2010 | Watanabe et al. |
| 7,858,947 B2 | 12/2010 | Mochizuki et al. |
| 7,897,930 B2 | 3/2011 | Mochizuki et al. |
| 7,923,695 B2 | 4/2011 | Ishii et al. |
| 7,932,946 B2 | 4/2011 | Ishii et al. |
| 8,067,743 B2 | 11/2011 | Ishii et al. |
| 8,154,641 B2 | 4/2012 | Nomura et al. |
| 8,368,027 B2 | 2/2013 | Ishii et al. |
| 8,440,975 B2 | 5/2013 | Inoue et al. |
| 8,519,344 B2 | 8/2013 | Ishii et al. |
| 8,680,472 B2 | 3/2014 | Mochizuki et al. |
| 8,829,456 B2 | 9/2014 | Sawada et al. |
| 8,957,383 B2 | 2/2015 | Sasaki et al. |
| 9,081,104 B2 | 7/2015 | Sawada et al. |
| 9,354,333 B2 | 5/2016 | Inoue et al. |
| 9,366,767 B2 | 6/2016 | Inoue et al. |
| 9,417,338 B2 | 8/2016 | Ishii et al. |
| 9,529,094 B2 | 12/2016 | Ishii et al. |
| 10,261,197 B2* | 4/2019 | Ushikura ................ G01T 1/202 |
| 10,283,555 B2* | 5/2019 | Ichimura ........... H01L 27/14683 |
| 10,345,455 B2 | 7/2019 | Ishii et al. |
| 10,739,514 B2* | 8/2020 | Kaneki ................ G02B 6/0083 |
| 10,838,082 B2* | 11/2020 | Ushikura ........... H01L 31/02325 |
| 2012/0183119 A1 | 7/2012 | Ikhlef et al. |
| 2013/0020493 A1 | 1/2013 | Ishii et al. |
| 2013/0099344 A1* | 4/2013 | Ishii ................. H01L 27/14618 |
| | | 257/432 |
| 2013/0187054 A1 | 7/2013 | Ishii et al. |
| 2013/0221198 A1 | 8/2013 | Sawada et al. |
| 2014/0034836 A1* | 2/2014 | Takei ................ H01L 27/14683 |
| | | 250/366 |
| 2014/0175295 A1* | 6/2014 | Takei ...................... G01T 1/202 |
| | | 250/366 |
| 2015/0316659 A1* | 11/2015 | Okamura ........... H01L 31/02322 |
| | | 250/367 |
| 2016/0091616 A1* | 3/2016 | Homma .................. G01T 1/202 |
| | | 250/361 R |
| 2016/0097865 A1 | 4/2016 | Sasaki et al. |
| 2016/0252629 A1* | 9/2016 | Hiratsuka ............. G01T 1/2018 |
| | | 250/369 |
| 2016/0291172 A1 | 10/2016 | Ono et al. |
| 2019/0139666 A1 | 5/2019 | Sasaki et al. |

FOREIGN PATENT DOCUMENTS

| | | |
|---|---|---|
| JP | 2014-106201 | 6/2014 |
| JP | 2015-114268 | 6/2015 |
| JP | 2016-118506 | 6/2016 |
| WO | 2011/161897 | 12/2011 |

\* cited by examiner

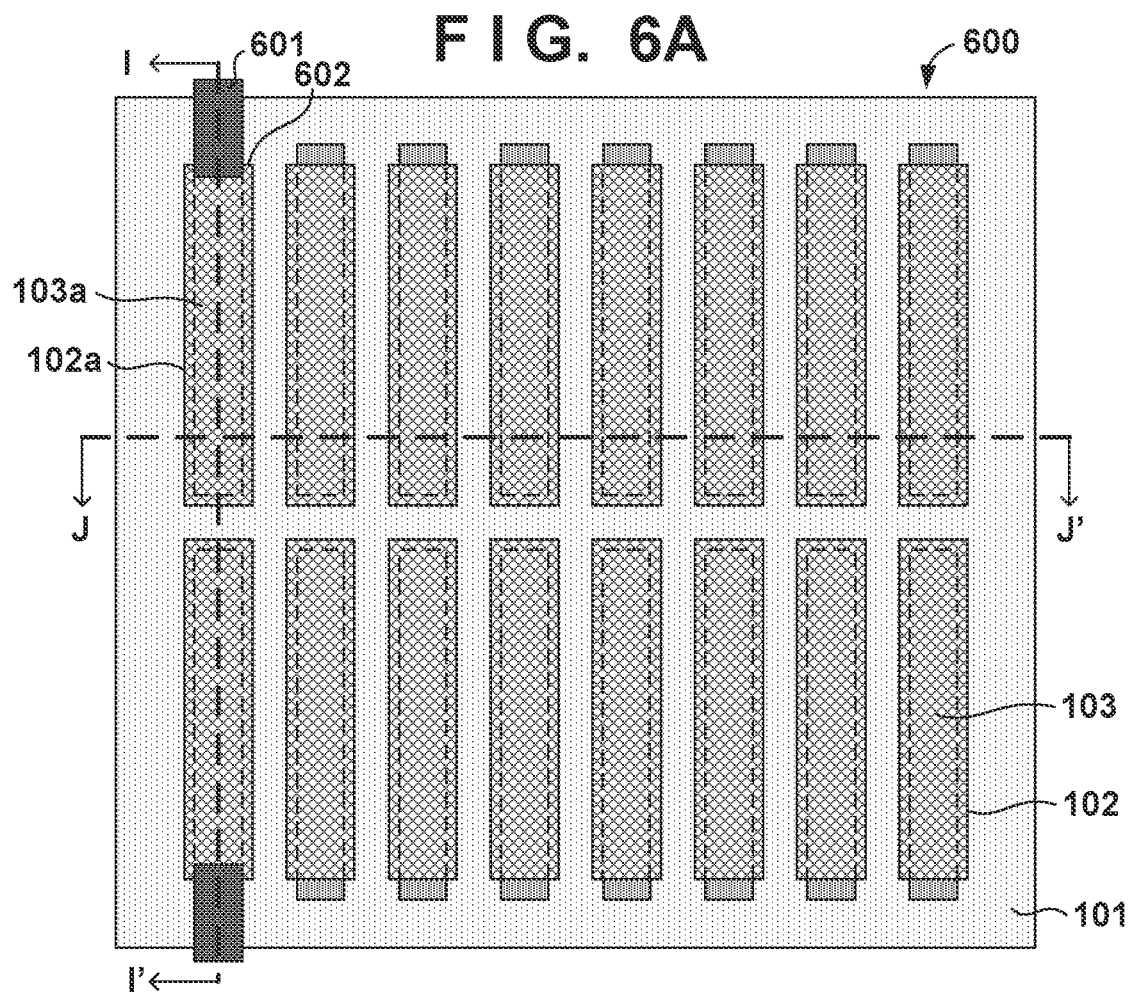
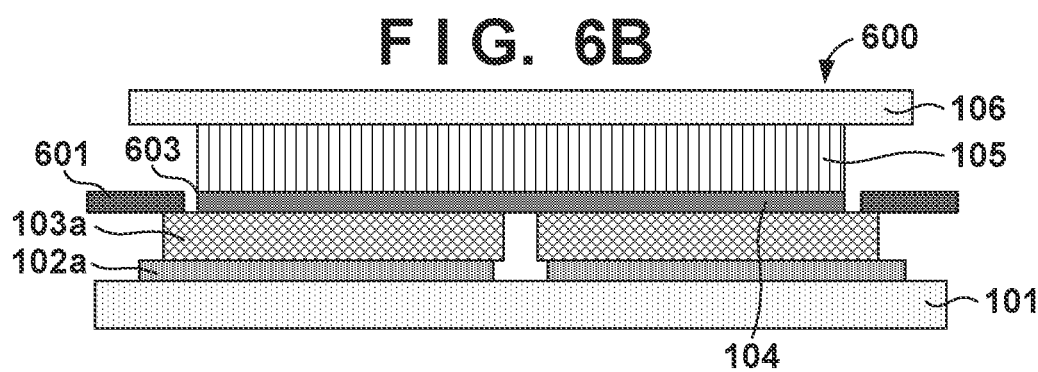
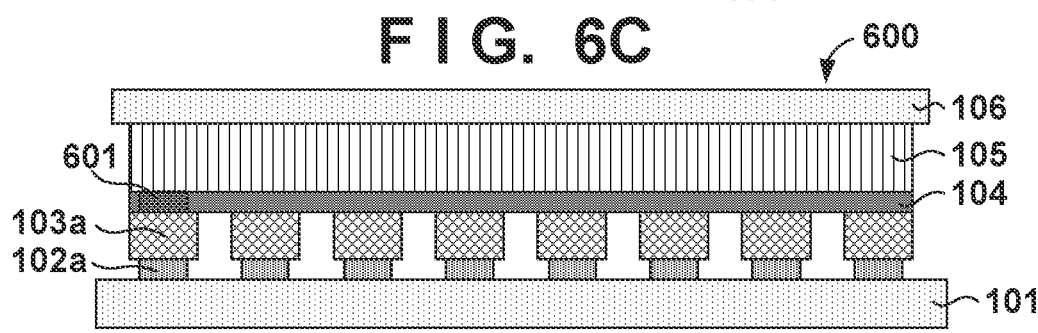

RADIATION IMAGING APPARATUS, MANUFACTURING METHOD THEREOF, AND RADIATION IMAGING SYSTEM

BACKGROUND OF THE INVENTION

Field of the Invention

The present invention relates to a radiation imaging apparatus, a manufacturing method thereof, and a radiation imaging system.

Description of the Related Art

There are known radiation imaging apparatuses called indirect-type radiation imaging apparatuses, in which incident radiation is converted into visible light by a scintillator, and the visible light is converted into electrical signals by photoelectric conversion elements of a sensor panel. Manufacturing methods of such indirect-type radiation imaging apparatuses include a method for directly forming a scintillator on a sensor panel (direct formation method), and a method for separately manufacturing a sensor panel and a scintillator panel, and adhering them to each other (indirect formation method). Japanese Patent Laid-Open No. 2015-114268 describes constituting a sensor panel by arranging a plurality of sensor chips in an array when forming a radiation imaging apparatus through the indirect formation method.

SUMMARY OF THE INVENTION

When manufacturing a radiation imaging apparatus in which a plurality of sensor chips constitute a sensor panel, through an indirect formation method, there have been cases where the sensor chips are shifted from their positions as designed. The present inventors have found that this is due to a bonding sheet, which bonds a base and the plurality of sensor chips to each other, entering the spaces between the sensor chips as a result of the scintillator panel being pressed against the sensor panel. An aspect of the present invention provides a technique for reducing positional shifts of the plurality of sensor chips that constitute the sensor panel.

According to some embodiments, a radiation imaging apparatus comprising: a sensor base; a sensor array that includes a plurality of sensor chips arranged in an array, and in which three or more sensor chips out of the plurality of sensor chips are arranged in one row of the sensor array; a scintillator positioned on a side opposite to the sensor base with respect to the sensor array; a bonding member that bonds the sensor array and the scintillator; and a plurality of bonding sheets that are separated from each other and bond the sensor base and the plurality of sensor chips, wherein two adjacent sensor chips out of the three or more sensor chips are bonded to the sensor base using separate bonding sheets out of the plurality of bonding sheets is provided.

Further features of the present invention will become apparent from the following description of exemplary embodiments with reference to the attached drawings.

BRIEF DESCRIPTION OF THE DRAWINGS

FIGS. 6A to 6C are diagrams illustrating a configuration example of a radiation imaging apparatus according to a fifth embodiment.

DESCRIPTION OF THE EMBODIMENTS

Embodiments of the present invention will be described below with reference to the accompanying drawings. Throughout various embodiments, the same reference signs are assigned to similar constituent elements, and overlapping description is omitted. In addition, the embodiments can be changed and combined as appropriate. Description will be given below on the embodiments of the present invention in a context of a radiation imaging apparatus that is used for a medical imaging diagnostic apparatus, an analysis apparatus, and the like. In the present specification, light includes visible light and infrared rays, and radiation includes X-rays, $\alpha$-rays, $\beta$-rays, and $\gamma$-rays.

First Embodiment

Figure 1A:
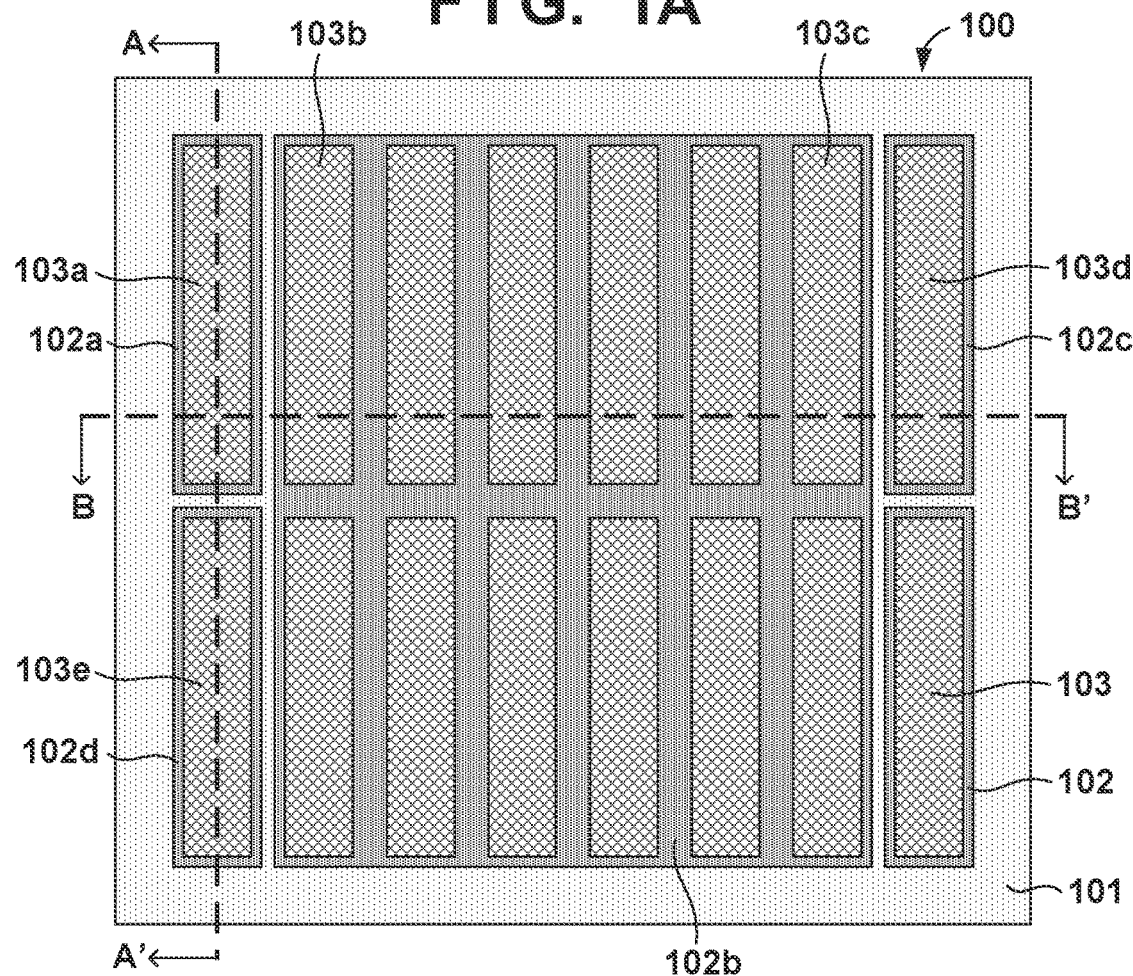
FIGS. 1A to 1C are diagrams illustrating a configuration example of a radiation imaging apparatus according to a first embodiment.
Figure 1B:
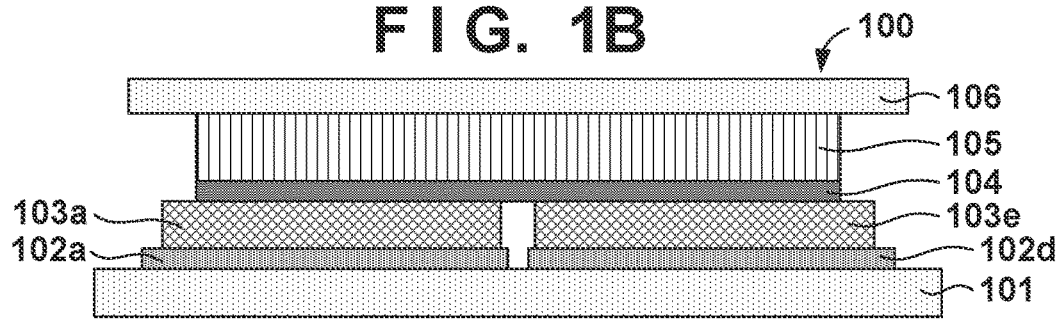
Figure 1C:
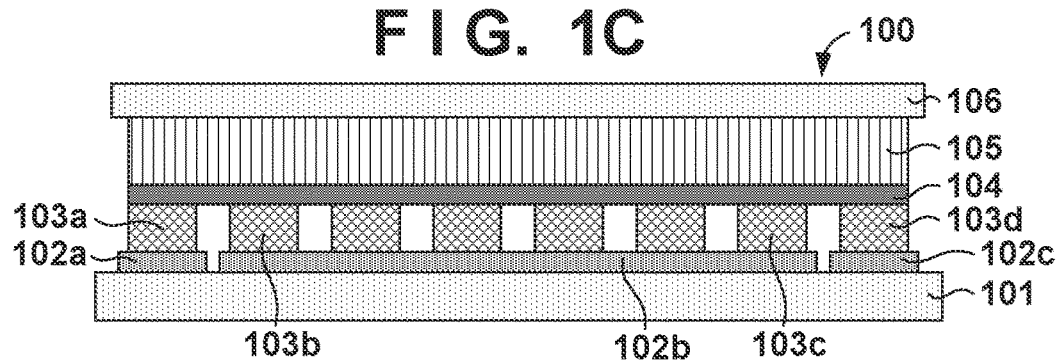

A configuration example of a radiation imaging apparatus 100 according to a first embodiment will be described with reference to FIGS. 1A to 1C. FIG. 1A is a plan view of the radiation imaging apparatus 100. FIG. 1B is a cross-sectional view cut along a line A-A' in FIG. 1A. FIG. 1C is a cross-sectional view cut along a line B-B' in FIG. 1A. In FIG. 1A, for convenience of description, a bonding member 104, a scintillator layer 105, and a scintillator base 106 are omitted.

The radiation imaging apparatus 100 in particular has a sensor base 101, a plurality of bonding sheets 102, a plurality of sensor chips 103, the bonding member 104, the scintillator layer 105, and the scintillator base 106. A specific bonding sheet 102 among the plurality of bonding sheets 102 is referred to using a suffix such as "bonding sheet 102a". A specific sensor chip 103 among the plurality of sensor chips 103 is referred to by using a suffix such as "sensor chip 103a". Radiation that has passed through a subject such as a patient passes through the scintillator base 106, and is converted into visible light by the scintillator layer 105. These visible light is converted into electrical signals by photoelectric conversion elements included in the plurality of sensor chips 103.

The plurality of sensor chips 103 are arranged in an array. The plurality of sensor chips 103 arranged in an array constitute a sensor array. In the sensor array, a direction along a line B-B' is referred to as a row direction, and a direction along a line A-A' is referred to as a column direction. In the example in FIG. 1A, the plurality of sensor chips 103 are arranged in two rows and eight columns, but there is no limitation to this. Each row of the sensor array includes three or more sensor chips 103. The plurality of sensor chips 103 are each shaped as a rectangle. A sensor chip 103 may be, for example, a CMOS sensor in which crystalline silicon is used, or a PIN-type sensor or a MIS-type sensor in which non-crystalline silicon is used. In each sensor chip 103, a plurality of pixel circuits are arranged in an array. Each pixel circuit includes a photoelectric conversion element, a transistor, and the like. The configuration of a sensor chip 103 may be that of an existing sensor chip, and thus a detailed description thereof is omitted.

The plurality of sensor chips 103 are bonded to the sensor base 101 using the plurality of bonding sheets 102. The plurality of bonding sheets 102 are separated from each other. In order to flatten the upper faces, in other words the faces of the plurality of sensor chips 103 that are in contact with the scintillator layer 105, the bonding sheets 102 may have cushioning properties. For example, a tape in which an adhesive material is applied to the two sides of a cushioning core material may be used as a bonding sheet 102. The core material may be formed of, for example, polyolefin-based resin, polyester, nonwoven fabric, chemical fiber, a wire woven in a lattice shape, or the like. Polystyrene resin that has a relatively high flexibility may be used as the polyolefin-based resin. For example, a metal wire or a resin wire may be used as the wire. For example, at least one of acrylic adhesive, epoxy adhesive, rubber-based adhesive, polyester-based adhesive, polyamide-based adhesive, vinyl alkyl ether-based adhesive, and/or silicone-based adhesive may be used as the adhesive material. From the viewpoint of the flatness and the thermal expansion coefficient, a metal, ceramics, glass, or a carbon material may be used as the material of the sensor base 101.

The scintillator layer 105 is attached to the scintillator base 106. The scintillator layer 105 and the scintillator base 106 constitute the scintillator panel. For example, CFRP, amorphous carbon, glass, or a metal (e.g., aluminum) is used as the material of the scintillator base 106.

The scintillator layer 105 may be a group of granulous scintillators, or a group of columnar scintillators. For example, oxysulfide gadolinium ($Gd_2O_2S$:Tb) containing a minute amount of terbium (Tb) is used as the granulous scintillators. For example, CsI:Tl, CsI:Na, CsBr:Tl, NaI:Tl, LiI:Eu, or KI:Tl is used as the columnar scintillators. If the scintillator layer 105 contains a halogen, the entire scintillator layer 105 may also be covered with a moisture-resistant film in order to prevent deterioration in performance due to humidity. The scintillator panel may also have, between the scintillator layer 105 and the scintillator base 106, a reflection layer for improving the luminance, or may also have an absorption layer for improving the MTF. The reflection layer may be formed of a metal such as Al or Ag, or may be formed of light-reflecting pigment containing $TiO_2$ or SrO. The absorption layer may be formed of a material such as black PET. The scintillator panel is positioned on the opposite side to the sensor base 101 with respect to the sensor array.

The sensor array and the scintillator panel are bonded using the bonding member 104. Specifically, the plurality of sensor chips 103 (the face on the opposite side to the sensor base 101) and the scintillator layer 105 (the face on the opposite side to the scintillator base 106) are bonded. The bonding member 104 is, for example, an adhesive sheet. Visible light passes through the bonding member 104, and reaches the sensor chips 103. The bonding member 104 may have a high transmissivity from the viewpoint of luminance, and may be thin from the viewpoint of the MTF. There are cases where a large crystal is generated while the scintillator is being formed, and the flatness of the surface of the scintillator is lost, depending on the type of the scintillator layer 105. When a large crystal is pressed against a sensor chip 103, there is a risk that the sensor chip 103 is damaged, and air bubbles are generated. In view of this, the bonding member 104 may have a thickness that is sufficient for covering the height of the large crystal. From the viewpoint of handling air bubbles and securing the MTF, the bonding member 104 may also have a thickness of about 10 to 100 The transmissivity of the bonding member 104 may be 80% or higher. An OCA film used for a liquid crystal display and the like may be used as the bonding member 104.

In the radiation imaging apparatus 100, 16 sensor chips 103 are bonded to the sensor base 101 using five bonding sheets 102. A sensor chip 103a is bonded to the sensor base 101 using a bonding sheet 102a only. The bonding sheet 102a is used only for bonding of the sensor chip 103a, and is not used for bonding of another sensor chip 103. A bonding sheet 102b is used for bonding of twelve sensor chips 103.

In each row in the sensor array, a first sensor chip 103 and a second sensor chip 103 from each end of the sensor array are bonded to the sensor base 101 using separate bonding sheets 102. Specifically, the first sensor chip 103a from an end of the sensor array is bonded using the bonding sheet 102a, and a second sensor chip 103b from the end of the sensor array is bonded using the bonding sheet 102b. In addition, two adjacent sensor chips 103 that are on an end of the respective rows in the sensor array, are also bonded to the sensor base 101 using separate bonding sheets 102. Specifically, in a row, the first sensor chip 103a from the end of the sensor array is bonded using the bonding sheet 102a, and, in the other row, a first sensor chip 103e from the end of the sensor array is bonded using a bonding sheet 102d.

Next, a manufacturing method of the radiation imaging apparatus 100 will be described. First, the above-described sensor panel and scintillator panel are formed individually. The sensor panel is formed by bonding the plurality of sensor chips 103 to the sensor base using the plurality of bonding sheets 102 separated from each other, such that the plurality of sensor chips 103 constitute the sensor array. First, the plurality of bonding sheets 102 are adhered onto the sensor base 101. Adhering of the bonding sheets 102 may be adhering using a hand roller, adhering using a dedicated apparatus, or the like. Next, the plurality of sensor chips 103 are aligned at equal intervals on the plurality of bonding sheets 102 so as to achieve the arrangement shown in FIG. 1A (i.e. tiling is performed).

The scintillator panel is formed by attaching the scintillator layer 105 to the scintillator base 106 (for example, through vapor deposition). When forming a reflection layer between the scintillator layer 105 and the scintillator base 106, a metal layer made of Al, Ag, or the like may also be formed on the surface of the scintillator base 106 through sputtering, and light-reflecting pigment containing $TiO_2$, SrO, or the like may be applied.

Subsequently, the sensor panel and the scintillator panel are bonded using the bonding member 104. First, the bonding member 104 (e.g., an adhesive sheet) is adhered over the scintillator layer 105. If the bonding member 104 can be adhered to the scintillator layer 105 at room temperature, the bonding member 104 can be adhered to the scintillator layer 105 using a hand roller, a laminating machine, or the like. Subsequently, the sensor panel is adhered to a face on the opposite side to this bonding member 104. The sensor panel is also adhered in a similar manner using a hand roller, a laminating machine, or the like. The radiation imaging apparatus 100 is manufactured through the above-described processes.

Figure 2A:
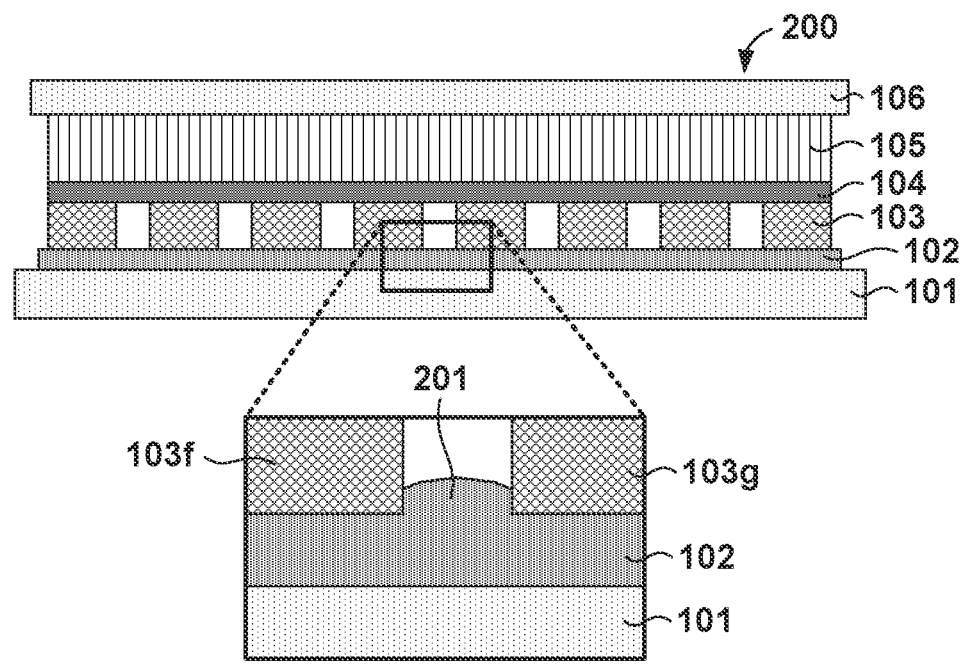
FIGS. 2A and 2B are diagrams illustrating the configuration of a radiation imaging apparatus according to a comparison example.

A radiation imaging apparatus 200 according to a comparison example will be described with reference to FIGS. 2A and 2B. The radiation imaging apparatus 200 is different from the radiation imaging apparatus 100 in that only one bonding sheet 102 is provided, and may be similar to the radiation imaging apparatus 100 in other respects. FIG. 2A is a cross-sectional view of the radiation imaging apparatus 200 at a position corresponding to FIG. 1B. The radiation imaging apparatus 200 is also manufactured by adhering a sensor panel and a scintillator panel to each other. During this adhering process, a plurality of sensor chips 103 are pressed toward a sensor base 101. As a result, a portion of a bonding sheet 102 enters a space between two adjacent sensor chips 103. For example, as shown in FIG. 2A, a portion 201 of the bonding sheet 102 enters the space between a sensor chip 103f and a sensor chip 103g. Due to this, the space between the two adjacent sensor chips 103f and 103g is broadened.

Figure 2B:
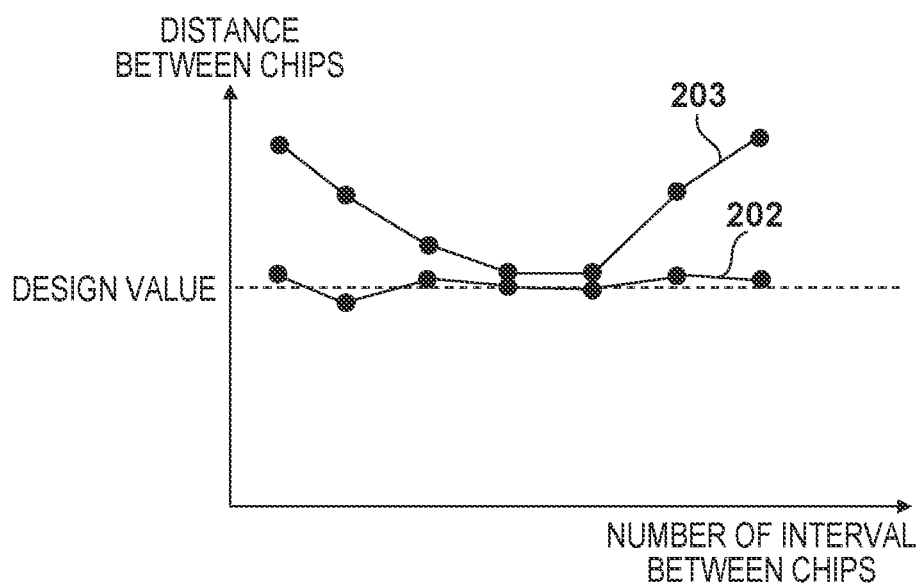

FIG. 2B is a graph illustrating broadening of an interval between sensor chips. The horizontal axis indicates the position of an interval between sensor chips 103 with a focus on one row of the sensor array. Each row includes eight sensor chips 103, and thus there are seven intervals. The vertical axis indicates a length of an interval. A graph 202 indicates the length before the scintillator panel is adhered to the sensor panel. A graph 203 indicates the intervals after the scintillator panel is adhered to the sensor panel. As indicated in FIG. 2B, an interval between adjacent sensor chips 103 at any position is broadened. In addition, it is also indicated that the closer to an end of the sensor array, the larger the degree of broadening. On the other hand, in the radiation imaging apparatus 100, in a partial region of the sensor array, two adjacent sensor chips 103 are bonded to the sensor base 101 using separate bonding sheets 102. Such an arrangement prevents positional shifts of the sensor chips 103.

The way of separation of the plurality of bonding sheets 102 is not limited to the example of the radiation imaging apparatus 100. For example, the plurality of bonding sheets 102 may also be separated at a central position in the row direction. Specifically, a configuration may also be adopted in which four sensor chips 103 on the left side of each row are bonded using one bonding sheet 102, and four sensor chips 103 on the right side are bonded using another bonding sheet 102. The length of the one bonding sheet 102 in the row direction is shortened, and thus the intervals between the sensor chips can be prevented from broadening. In the radiation imaging apparatus 100, also in the column direction, in a partial region of the sensor array, two adjacent sensor chips 103 are bonded to the sensor base 101 using separate bonding sheets 102. The number of sensor chips 103 aligned in the column direction is small (two in this example), and thus such two sensor chips 103 may be bonded using the same bonding sheet 102, in any region.

Second Embodiment

Figure 3A:
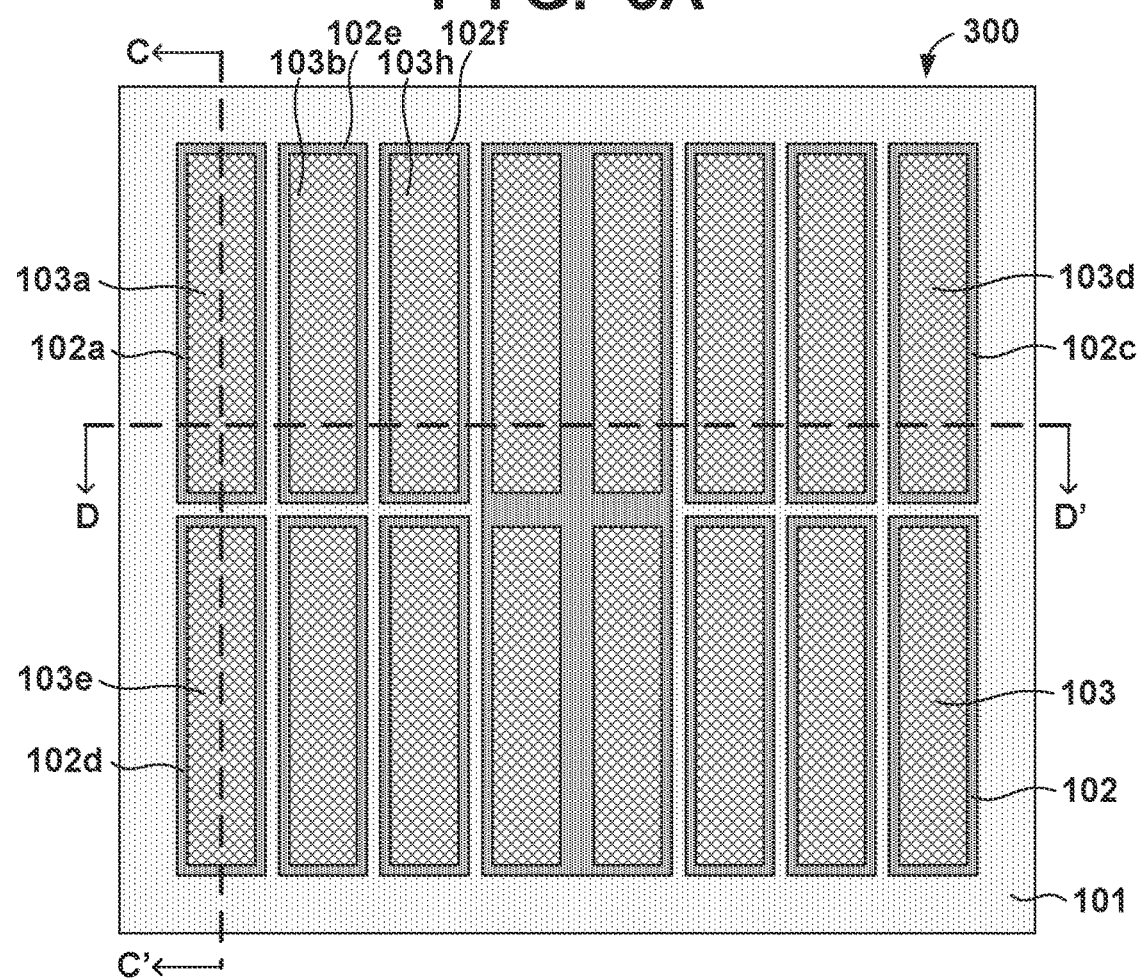
FIGS. 3A to 3C are diagrams illustrating a configuration example of a radiation imaging apparatus according to a second embodiment.
Figure 3B:
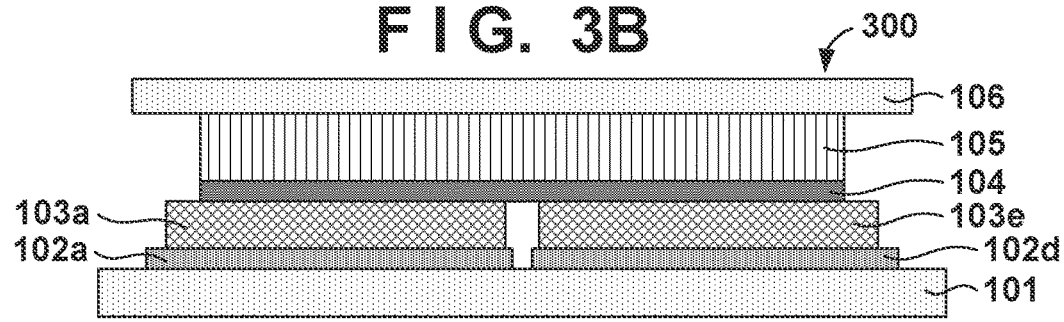
Figure 3C:
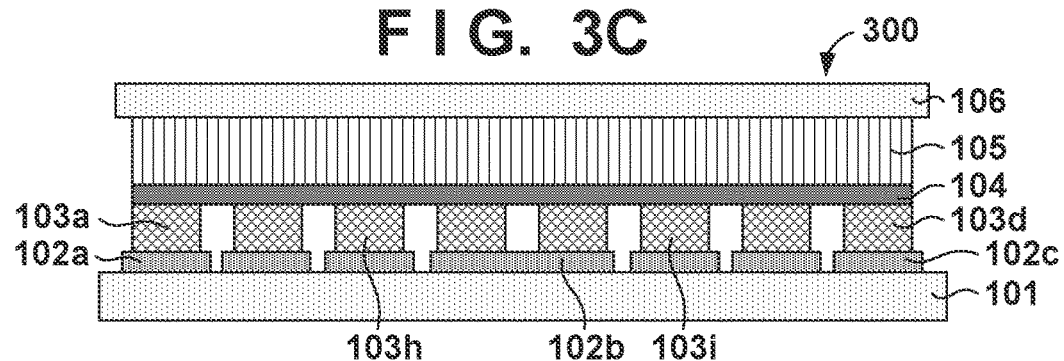

A configuration example of a radiation imaging apparatus 300 according to a second embodiment will be described with reference to FIGS. 3A to 3C. FIG. 3A is a plan view of the radiation imaging apparatus 300. FIG. 3B is a cross-sectional view cut across a line C-C' in FIG. 3A. FIG. 3C is a cross-sectional view cut across a line D-D' in FIG. 3A. In FIG. 3A, for convenience of description, a bonding member 104, a scintillator layer 105, and a scintillator base 106 are omitted. Differences from the radiation imaging apparatus 100 will be mainly described below.

In the radiation imaging apparatus 300, a second sensor chip and a third sensor chip from an end of the sensor array in each row of the sensor array are bonded to the sensor base using separate bonding sheets. Specifically, a second sensor chip 103b from the end of the sensor array is bonded using a bonding sheet 102e, and a third sensor chip 103h from the end of the sensor array is bonded using a bonding sheet 102f. Such an arrangement further prevents position deviation of sensor chips 103.

Third Embodiment

Figure 4A:
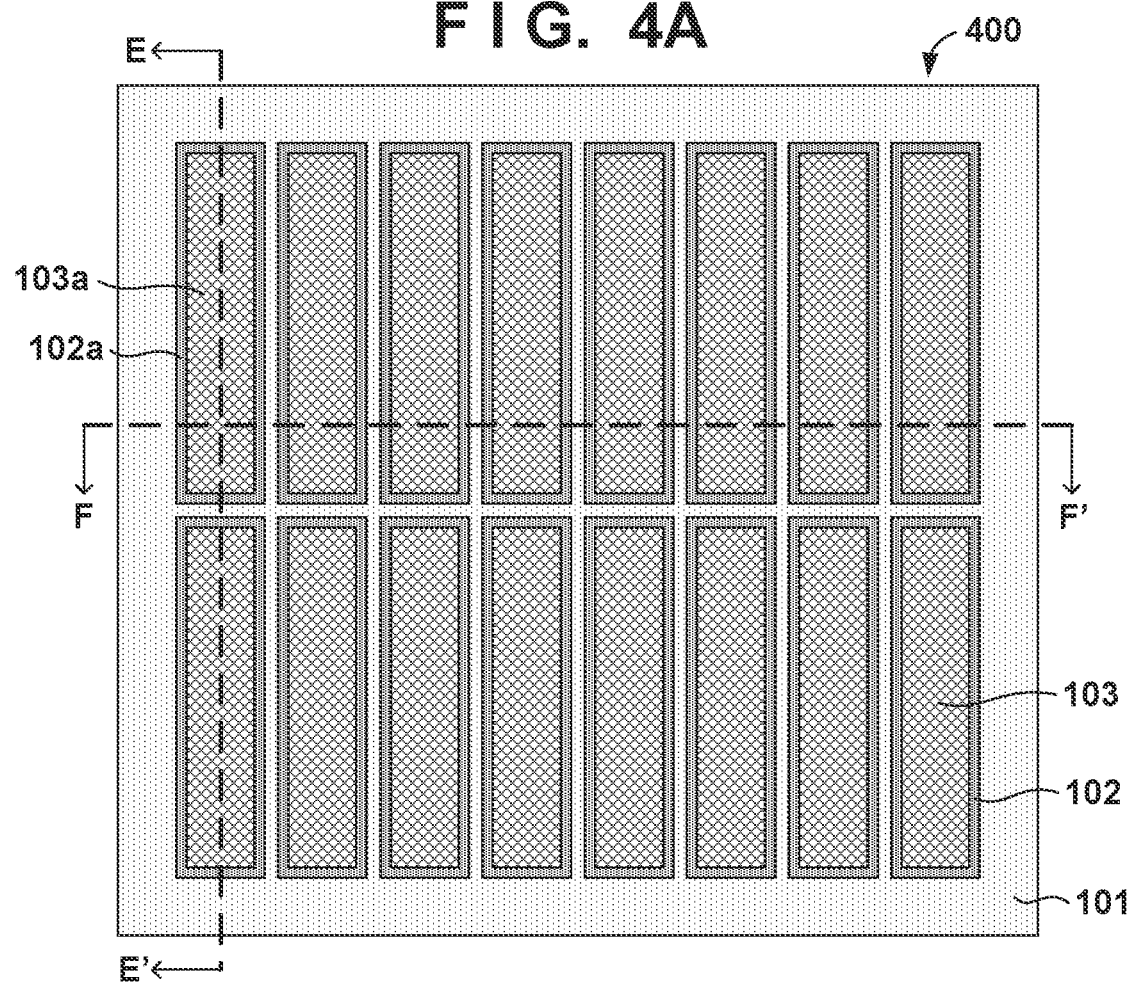
FIGS. 4A to 4C are diagrams illustrating a configuration example of a radiation imaging apparatus according to a third embodiment.
Figure 4B:
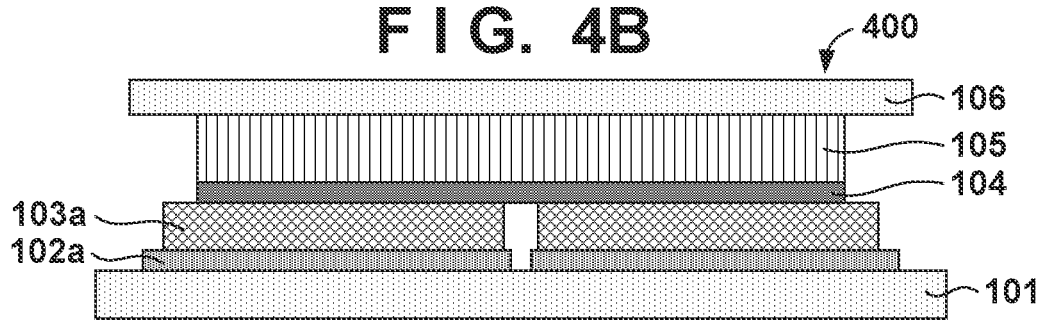
Figure 4C:
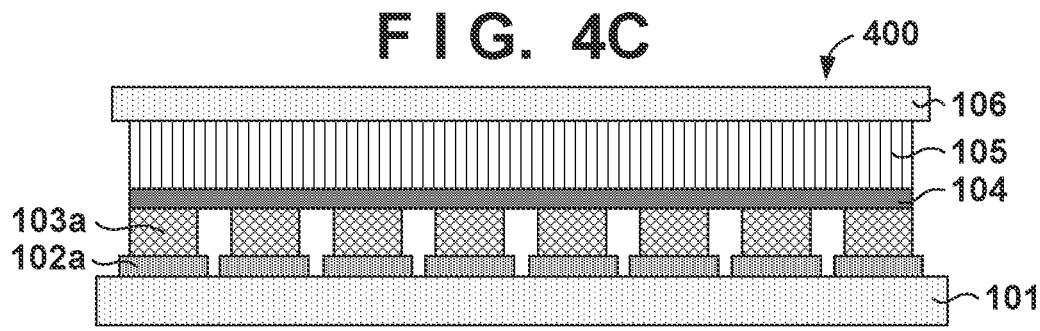

A configuration example of a radiation imaging apparatus 400 according to a third embodiment will be described with reference to FIGS. 4A to 4C. FIG. 4A is a plan view of the radiation imaging apparatus 400. FIG. 4B is a cross-sectional view cut along a line E-E' in FIG. 4A. FIG. 4C is a cross-sectional view cut along a line F-F' in FIG. 4A. In FIG. 4A, for convenience of description, a bonding member 104, a scintillator layer 105, and a scintillator base 106 are omitted. Differences from the radiation imaging apparatus 100 will be mainly described below.

In the radiation imaging apparatus 400, in the entire region of the sensor array, two adjacent sensor chips 103 are bonded to the sensor base 101 using separate bonding sheets 102. In other words, the plurality of sensor chips 103 and the plurality of bonding sheets 102 have one-to-one correspondence. Such an arrangement further prevents position deviation of the sensor chips 103.

Fourth Embodiment

Figure 5A:
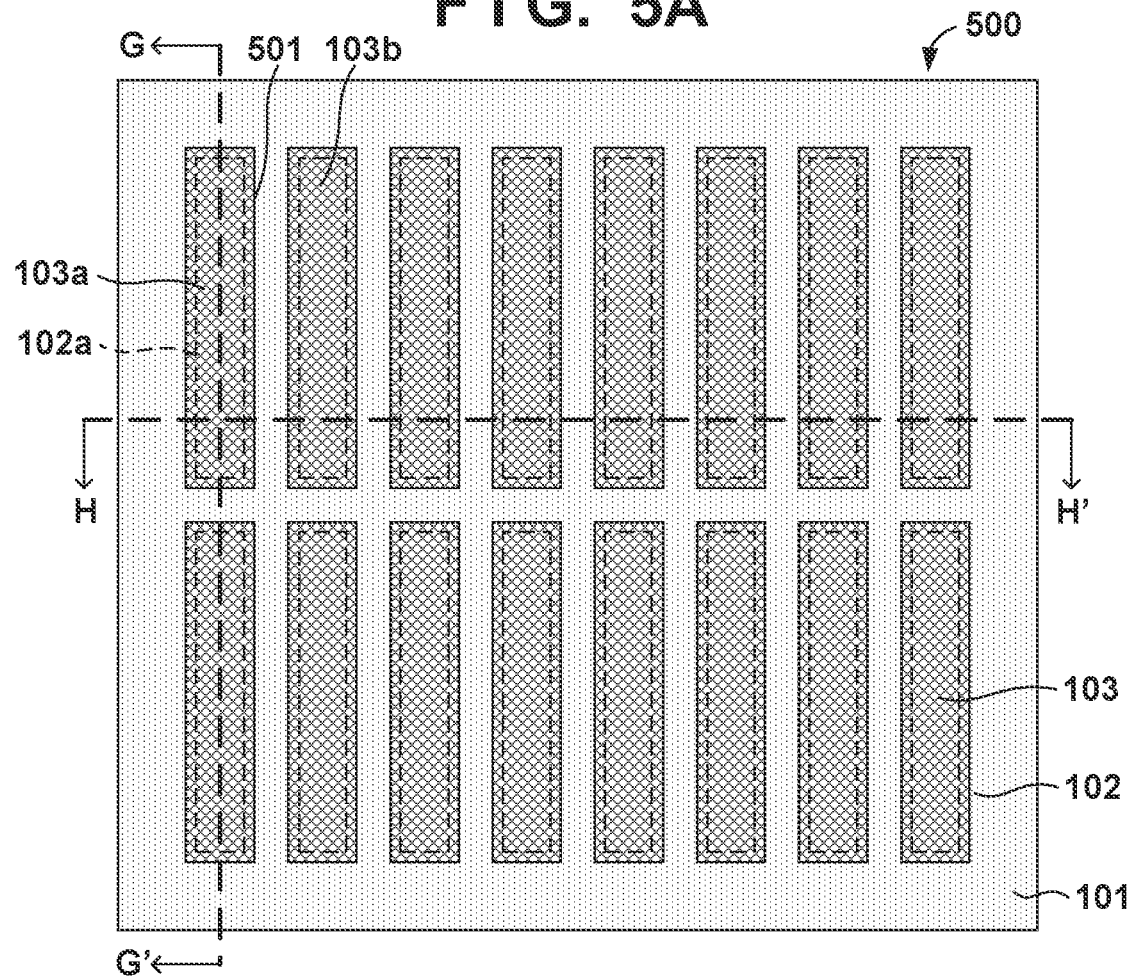
FIGS. 5A to 5C are diagrams illustrating a configuration example of a radiation imaging apparatus according to a fourth embodiment.
Figure 5B:
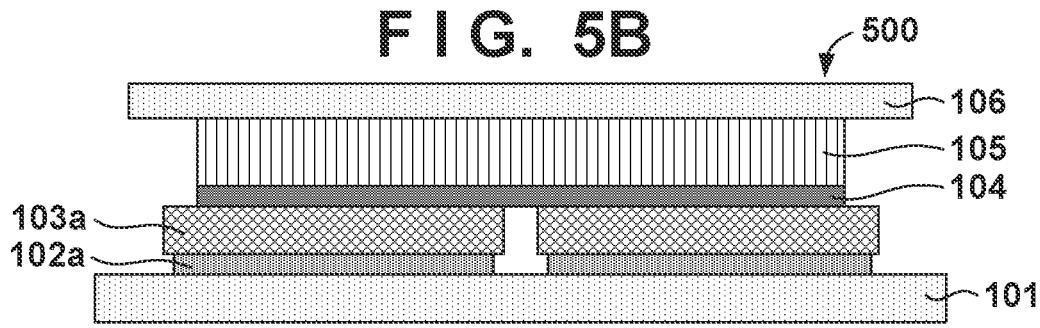
Figure 5C:
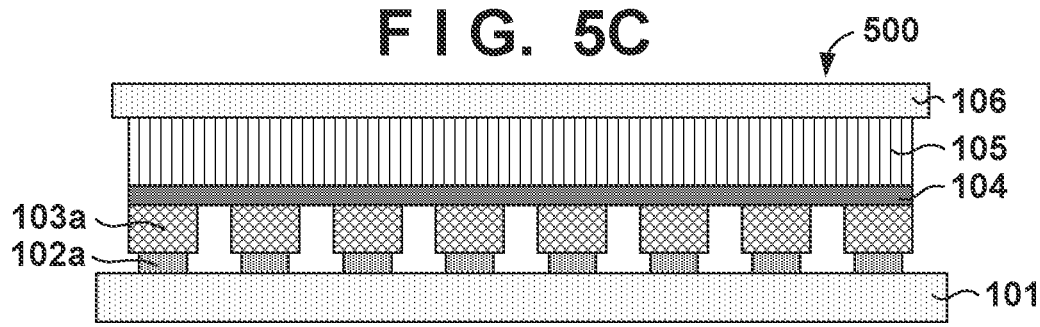

A configuration example of a radiation imaging apparatus 500 according to a fourth embodiment will be described with reference to FIGS. 5A to 5C. FIG. 5A is a plan view of the radiation imaging apparatus 500. FIG. 5B is a cross-sectional view cut along a line G-G' in FIG. 5A. FIG. 5C is a cross-sectional view cut along a line H-H' in FIG. 5A. In FIG. 5A, for convenience of description, a bonding member 104, a scintillator layer 105, and a scintillator base 106 are omitted. Differences from the radiation imaging apparatus 100 will be mainly described below.

In the radiation imaging apparatus 500, on a side that faces an adjacent sensor chip 103, out of the sides of a sensor chip bonded to the sensor base 101 using a bonding sheet 102 that is separate from that of the adjacent sensor chip 103, the outer periphery of the bonding sheet 102 is positioned inward of that side. Specifically, on a side 501 that faces an adjacent sensor chip 103b, out of the sides of a sensor chip 103a bonded using a bonding sheet 102a that is separate from that of the sensor chip 103b, the outer periphery of the bonding sheet 102a is positioned inward of the side 501.

Even if the plurality of bonding sheets 102 are separated from each other, when the scintillator panel is adhered, there is a possibility that two adjacent bonding sheets 102 come into contact with each other, and a state similar to that in FIG. 2A is entered, depending on the material and size of the bonding sheets 102. In view of this, in the radiation imaging apparatus 500, such contact is suppressed by broadening an interval between two adjacent bonding sheets 102. From among the sides of a sensor chip bonded to the sensor base 101 using a bonding sheet 102 that is separate from that of an adjacent sensor chip 103, on sides other than a side that faces the adjacent sensor chip 103, the outer periphery of the bonding sheet 102a may be inward or outward of that side. In the radiation imaging apparatus 500, the outer periphery of the bonding sheet 102a is inward of those sides as well.

Fifth Embodiment

A configuration example of a radiation imaging apparatus 600 according to a fifth embodiment will be described with reference to FIG. 6A to 6C. FIG. 6A is a plan view of the radiation imaging apparatus 600. FIG. 6B is a cross-sectional view cut along a line I-I' in FIG. 6A. FIG. 6C is a cross-sectional view cut along a line J-J' in FIG. 6A. In FIG. 6A, for convenience of description, a bonding member 104, a scintillator layer 105, and a scintillator base 106 are omitted. Differences from the radiation imaging apparatus 100 will be mainly described below.

In the radiation imaging apparatus 600, at least some sensor chips 103 out of a plurality of sensor chips 103 have a side on which a wiring member is arranged. In FIG. 6A, only some of the sensor chips 103 have a wiring member 601, but, instead, all of the sensor chips 103 may have the wiring member 601. The wiring member 601 is a member for transmitting a signal from the sensor chip 103 to an external apparatus. The wiring member 601 is, for example, an FPC (flexible printed substrate).

A sensor chip 103a has the wiring member 601 on its side 602 that is directed toward the outside of the sensor array, out of its two shorter sides. On this side 602 on which the wiring member 601 is arranged, a bonding sheet 102a may extend beyond an orthogonal projection of an edge 603 of the scintillator layer 105 to the outside of the sensor chip 103a. Here, on this side 602 on which the wiring member 601 is arranged, the bonding sheet 102a extends beyond the side 602 to the outside of the sensor chip 103a.

When bonding the sensor panel and scintillator panel, the sensor chips 103 receive intense stress from the edge 603 of the scintillator layer 105. In the radiation imaging apparatus 600, the bonding sheet 102a supports the edge of the sensor chip 103 from below on the side 602, and thus it is possible to suppress damage of the sensor chip 103 due to this stress.

On the sides other than the side on which the wiring member 601 is arranged, the outer periphery of the bonding sheet 102a may be inward or outward of those sides. In the radiation imaging apparatus 600, similarly to the radiation imaging apparatus 500, the outer periphery of the bonding sheet 102a is inward of those sides.

Sixth Embodiment

Figure 7A:
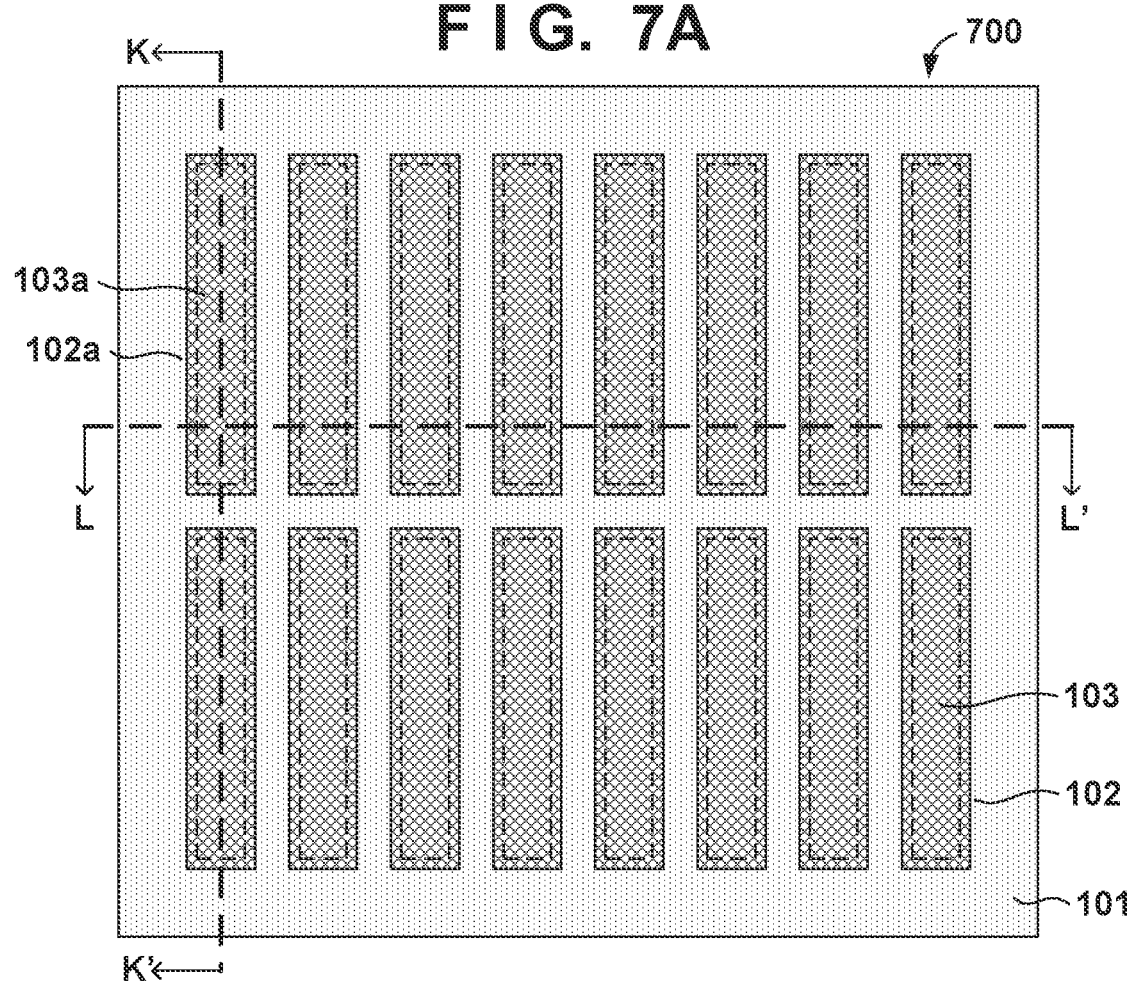
FIGS. 7A to 7C are diagrams illustrating a configuration example of a radiation imaging apparatus according to a sixth embodiment.
Figure 7B:
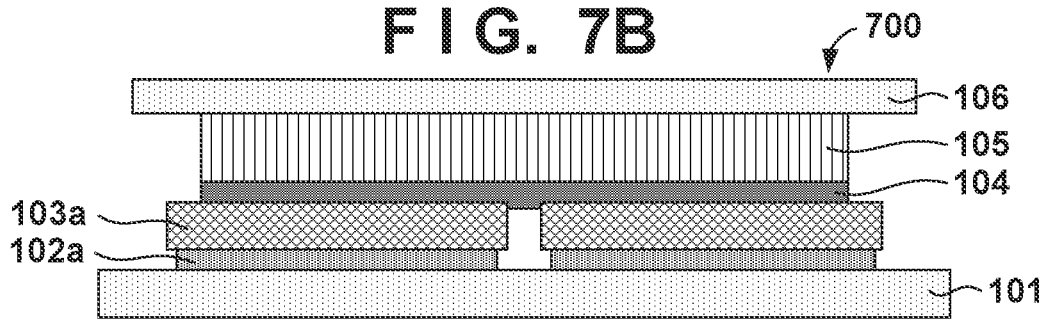
Figure 7C:
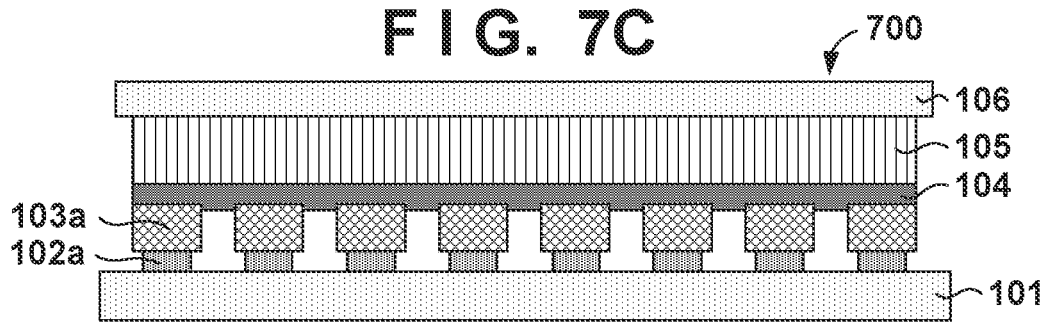

A configuration example of a radiation imaging apparatus 700 according to a sixth embodiment will be described with reference to FIGS. 7A to 7C. FIG. 7A is a plan view of the radiation imaging apparatus 700. FIG. 7B is a cross-sectional view cut along a line K-K' in FIG. 7A. FIG. 7C is a cross-sectional view cut along a line L-L' in FIG. 7A. In FIG. 7A, for convenience of description, a bonding member 104, a scintillator layer 105, and a scintillator base 106 are omitted. Differences from the radiation imaging apparatus 100 will be mainly described below.

In the radiation imaging apparatus 700, the bonding member 104 is formed of a hot melt material, for example, a hot melt sheet. The hot melt material refers to a material that has a property of exhibiting adhesion force when heated. The viscosity of the hot melt sheet decreases by being heated, and thus, as shown in FIGS. 7B and 7C, the bonding member 104 enters spaces between the sensor chips 103. As a result, the adhesive force of the bonding member 104 to the sensor chips 103 improves.

The transparency of the hot melt sheet may be, for example, 90% or higher in the vicinity of 550 nm, which is a peak emission wavelength of CsI:Tl. In addition, the thickness of the hot melt sheet may be about 10 to 100 from the viewpoint of prevention of deterioration in the MTF and prevention of damage due to an extraneous material that enters the space between the scintillator layer 105 and sensor chips 103.

When a hot melt sheet is used as the bonding member 104, the sensor panel and the scintillator panel are bonded to each other by performing heat pressure bonding using a laminating machine capable of heating. When performing heat pressure bonding in this manner, the viscosity of the bonding sheet 102 also decreases, and some of the bonding sheets 102 easily enter spaces between sensor chips 103. Even in this case, by bonding the plurality of sensor chips 103 using the plurality of bonding sheets 102 separated from each other, positional shifts of the sensor chips 103 can be suppressed.

Other Embodiments

Figure 8:
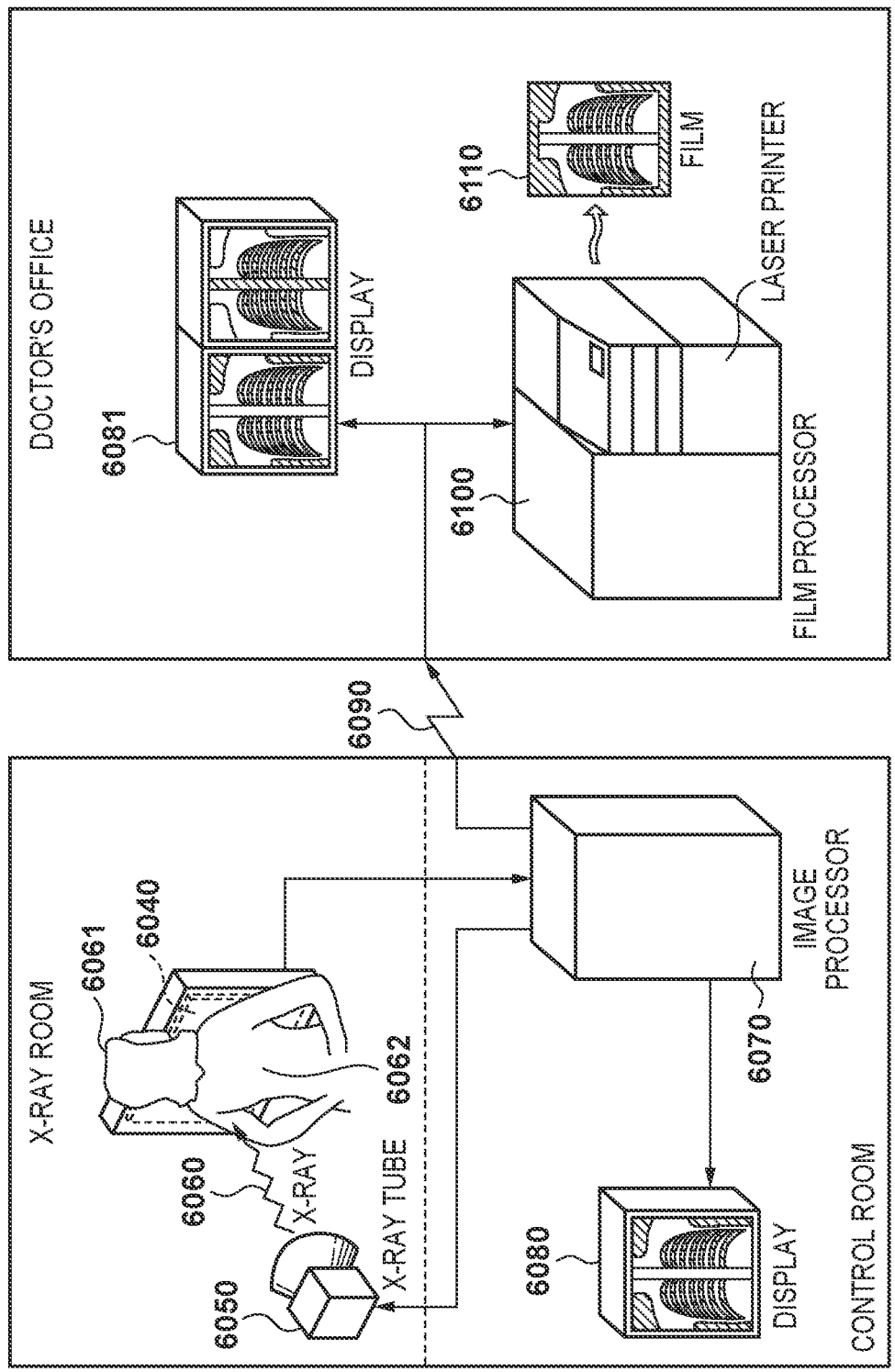
FIG. 8 is a diagram illustrating a configuration example of a radiation imaging system according to another embodiment.

FIG. 8 is a diagram showing an example in which the radiation imaging apparatus according to the present invention is applied to an X-ray diagnosis system (radiation imaging system). An X-ray 6060 (radiation) generated in an X-ray tube 6050 (radiation source) passes through a chest 6062 of a test subject or a patient 6061, and is incident on a radiation imaging apparatus 6040. The radiation imaging apparatus 6040 may be any of the radiation imaging apparatuses of the above embodiments. This incident X-ray includes information regarding the internal body of the patient 6061. The scintillator emits light in response to incidence of an X-ray, and this light is subjected to photoelectric conversion, and electrical information is acquired. This information is converted into digital signals, which are subjected to image processing by an image processor 6070, which is a signal processing unit, and can be observed on a display 6080 that is a display unit of a control chamber. Note that the radiation imaging system at least has a radiation imaging apparatus, and a signal processing unit that processes a signal from the radiation imaging apparatus.

In addition, this information can be transferred to a remote location by a transmission processing unit such as a phone line 6090, and can be displayed on a display 6081 (display unit) of a doctor's office or the like in another location or can be stored to an optical disk or the like (recording unit), and can be used for a medical practitioner in a remote location to make a diagnosis. It is also possible to record this information to a film 6110 (recording medium) by a film processor 6100 (recording unit).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-138015, filed Jul. 23, 2018 which is hereby incorporated by reference herein in its entirety.

What is claimed is:

1. A radiation imaging apparatus, comprising:
a sensor base;

a sensor array that includes a plurality of sensor chips arranged in an array, and in which three or more sensor chips of the plurality of sensor chips are arranged in one row of the sensor array;

a scintillator positioned on a side opposite to the sensor base with respect to the sensor array;

a bonding member that bonds the sensor array and the scintillator: and a plurality of bonding sheets that are separated from each other and bond the sensor base and the plurality of sensor chips wherein two adjacent sensor chips out of the three or more sensor chips are bonded to the sensor base using separate bonding sheets out of the plurality of bonding sheets, at least some sensor chips of the plurality of sensor chips have a side on which a wiring member is arranged and on the side on which the member is arranged, the bonding sheet extends beyond the side to the outside of the sensor chip.

2. The radiation imaging apparatus according to claim 1, wherein a first sensor chip and a second sensor chip from an end of the sensor array are bonded to the sensor base using separate bonding sheets in each row in the sensor array.

3. The radiation imaging apparatus according to claim 2, wherein the second sensor chip and a third sensor chip from the end of the sensor array are bonded to the sensor base using separate bonding sheets in each row in the sensor array.

4. The radiation imaging apparatus according to claim 1, wherein two adjacent sensor chips are bonded to the sensor base using separate bonding sheets in an entire region of the sensor array.

5. The radiation imaging apparatus according to claim 1, wherein the plurality of sensor chips correspond one-to-one with the plurality of bonding sheets.

6. The radiation imaging apparatus according to claim 1, wherein each of the plurality of sensor chips is shaped as a rectangle, and among sides of a sensor chip bonded to the sensor base using a bonding sheet that is separate from a bonding sheet of the adjacent sensor chip, on a side facing an adjacent sensor chip an outer periphery of the bonding sheet is positioned inward of the side facing the adjacent sensor chip.

7. The radiation imaging apparatus according claim 1, wherein at least some sensor chips of the plurality of sensor chips have a side on which a wiring member is arranged the bonding sheets are tape comprising a cushioning core material with adhesive material applied to two opposing sides, and among two shorter sides of the sensor chip, the side on which the wiring member is arranged is directed towards the outside of the sensor array.

8. The radiation imaging apparatus according to claim 1, wherein the bonding member has a property of exhibiting adhesion force when heated.

9. A radiation imaging system, comprising:
the radiation imaging apparatus according to claim 1; and
a processing unit configured to process a signal acquired by the radiation imaging apparatus.

10. A method for manufacturing a radiation imaging apparatus, comprising the steps of:

forming a sensor panel by banding a plurality of sensor chips to a sensor base using a plurality of bonding sheets separated from each other, such that three or more sensor chips of the plurality of sensor chips are arranged in one row of a sensor array in which the plurality of sensor chips are arranged in an array; and bonding, the sensor panel and a scintillator using a bonding member such that the scintillator is positioned on a side opposite to the sensor base with respect to the sensor array, wherein at least some sensor chips of the plurality of sensor chips have a side on which a wiring is arranged, and forming the sensor panel includes bonding two adjacent sensor chips out of the three or more sensor chips to the sensor base using separate bonding sheets of the plurality of bonding sheets.

11. The method according to claim 10, wherein the scintillator and the sensor array are bonded through heat pressure bonding.

* * * * *